(12) United States Patent
Shin et al.

(10) Patent No.: US 8,866,224 B2
(45) Date of Patent: Oct. 21, 2014

(54) DISPLAY DEVICE

(71) Applicant: LG Display Co., Ltd., Seoul (KR)

(72) Inventors: Byong Wook Shin, Daegu (KR); Ji Eun Chae, Gyeongbuk (KR); Tae Keun Lee, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 22 days.

(21) Appl. No.: 13/857,288

(22) Filed: Apr. 5, 2013

(65) Prior Publication Data

US 2013/0270582 A1    Oct. 17, 2013

(30) Foreign Application Priority Data

Apr. 16, 2012  (KR) .......................... 10-2012-0039066

(51) Int. Cl.
| | |
|---|---|
| *H01L 29/66* | (2006.01) |
| *H01L 21/77* | (2006.01) |
| *H01L 33/08* | (2010.01) |
| *H01L 33/48* | (2010.01) |

(52) U.S. Cl.
CPC ................ *H01L 33/48* (2013.01); *H01L 21/77* (2013.01); *H01L 33/08* (2013.01)
USPC ............. 257/343; 257/E29.261; 257/E21.417

(58) Field of Classification Search
CPC ................ H01L 2924/13069; H01L 27/1251; H01L 27/3248; H01L 27/3246; H01L 27/3267
USPC ............ 257/343, E29.261, E21.417; 438/286
See application file for complete search history.

(56) References Cited

U.S. PATENT DOCUMENTS

| | | | |
|---|---|---|---|
| 2007/0080905 A1* | 4/2007 | Takahara ........................ | 345/76 |
| 2010/0265277 A1* | 10/2010 | Takahara ........................ | 345/690 |
| 2010/0277401 A1* | 11/2010 | Takahara et al. ............... | 345/76 |

\* cited by examiner

*Primary Examiner* — Elias M Ullah (74) *Attorney, Agent, or Firm* — Morgan, Lewis & Bockius LLP (57) ABSTRACT

Disclosed are a TFT array substrate for decreasing a bezel width and a display device including the same. The display device includes a first substrate including a display area (including a pixel formed in a pixel area defined by a gate line and a data line which intersect) and a non-display area that includes a built-in shift register connected to the gate line and a gate link part connected to the built-in shift register, a second substrate facing the first substrate, and a seal pattern formed in the non-display area of the first substrate in correspondence with an edge portion of the second substrate to facing-couple the first and second substrates. The seal pattern includes a first hardening area hardened by a first hardening process, and a second hardening area hardened by a second hardening process.

16 Claims, 7 Drawing Sheets

DISPLAY DEVICE

CROSS-REFERENCE TO RELATED APPLICATIONS

This application claims the benefit of the Korean Patent Application No. 10-2012-0039066 filed on Apr. 16, 2012, which is hereby incorporated by reference as if fully set forth herein.

BACKGROUND

1. Field of the Invention

The present invention relates to a display device including a thin film transistor (TFT) array substrate.

2. Discussion of the Related Art

Recently, as the times advance to the information-oriented society, flat panel display devices are needed because having good characteristics in thinning and lightening thereof and the realization of low consumption power. In the flat panel display devices, liquid crystal display (LCD) devices are good in resolution, color display, and image quality, and thus are commercialized as display devices for notebook computers, tablet computers, and desktop computers.

Generally, LCD devices are devices in which two substrates with electrodes formed therein are disposed such that the electrodes of the two substrates face each other, liquid crystal is injected between the facing electrodes, liquid crystal molecules are realigned with electric fields that are generated by applying different voltages to the facing electrodes, and thus, an image is realized by a light transmittance that is changed according to the realignment of the liquid crystal molecules.

The LCD devices include a liquid crystal display panel in which a liquid crystal layer is formed between two substrates, a backlight that irradiates light on the liquid crystal display panel, and a driving circuit part for driving the liquid crystal display panel.

Generally, the driving circuit part is implemented on a printed circuit board (PCB). The driving circuit part includes: a gate driving circuit part that is connected to gate lines of the liquid crystal display panel and applies a gate signal to the gate lines; and a data driving circuit part that is connected to data lines of the liquid crystal display panel and applies data signals to the respective data lines.

The driving circuit part is mounted on a tape carrier package (TCP) or a chip on film (COF), and attached to one side or both sides of the liquid crystal display panel.

Recently, gate-in panel (GIP) type LCD devices in which some circuits of a gate driving circuit part are formed simultaneously with a process of forming TFTs of a liquid crystal display panel are proposed for reducing the volume and weight of the LCD device affected by a driving circuit part and decreasing a bezel width.

Figure 1:
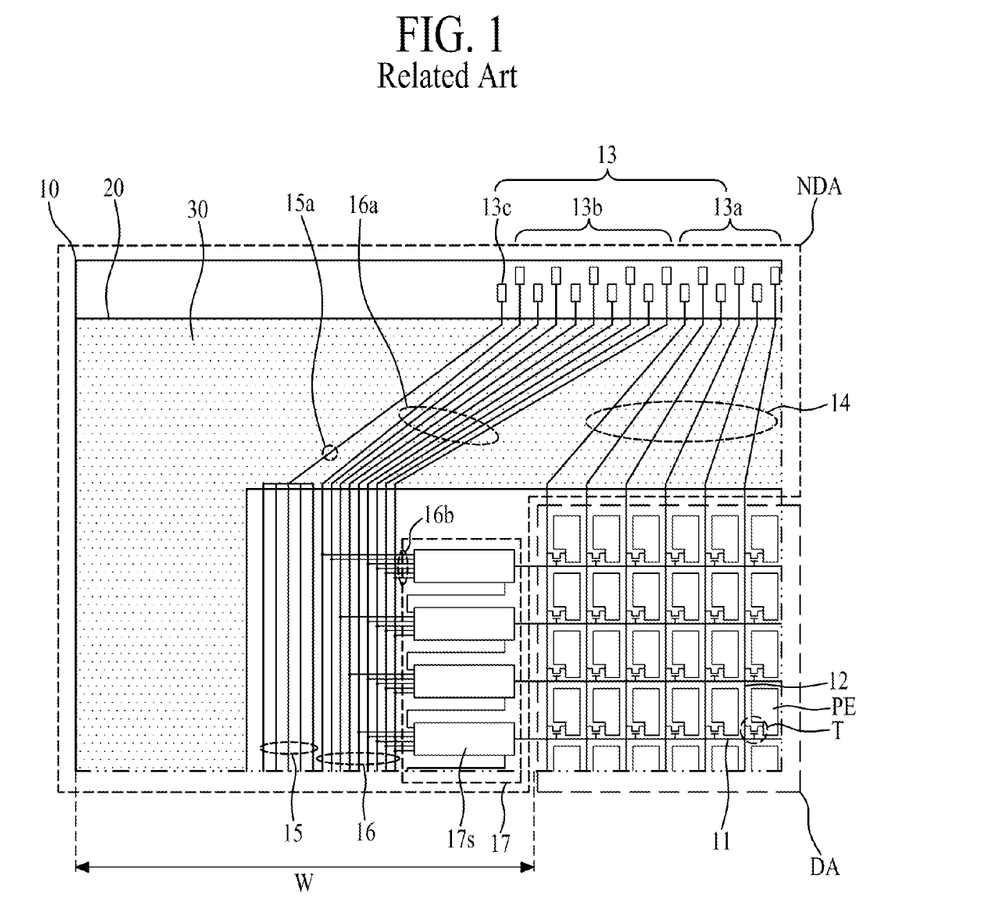
FIG. 1 is a plan view schematically illustrating a related art GIP type LCD device.

FIG. 1 is a plan view schematically illustrating a related art GIP type LCD device.

Referring to FIG. 1, the related art GIP type LCD device includes a first substrate 10 that is a lower substrate, a second substrate 20 that is an upper substrate, and a seal pattern 30 in which the first and second substrates 10 and 20 are facing-coupled to each other with a liquid crystal layer (formed between the first and second substrates 10 and 20, not shown) therebetween.

The first substrate 10 is a TFT array substrate, and includes a display area DA for displaying an image and a non-display area NDA that is formed to surround the display area DA and cannot display an image.

A plurality of gate lines 11, a plurality of data lines 12, a plurality of thin film transistors T, and a plurality of pixel electrodes PE are formed in the display area DA of the first substrate 10.

The gate lines 11 and the data lines 12 intersect to define a plurality of pixel areas. Each of the thin film transistors T is a switching element, and is connected to a corresponding gate line 11 and a corresponding data line 12 and turned on with a gate signal applied to the gate line 11 to supply a data signal, applied from the data line 12, to a corresponding pixel electrode PE.

Each of the pixel electrodes PE is connected to a corresponding thin film transistor T, and generates an electric field with a data signal supplied from the thin film transistor T to realign the liquid crystal molecules of the liquid crystal layer.

A pad part 13, a plurality of data link lines 14, a common voltage line part 15, a gate link part 16, and a built-in shift register 17 are disposed in the non-display area NDA of the first substrate 10.

The pad part 13 includes a data pad part 13a, a gate pad part 13b, and a common voltage pad part 13c.

The data pad part 13a is disposed at an upper side of the non-display area NDA which is one side surface (upper side of a first gate line) of an upper side of the first substrate 10, and connected to an external driving circuit part (not shown). The gate pad part 13b is disposed at one side of the data pad part 13a, and connected to the external driving circuit part. The common voltage pad part 13c is disposed at one side of the gate pad part 13b, and connected to a common voltage generator (not shown) of the external driving circuit part.

Each of the data link lines 14 is extended from a corresponding data line 12, and connects a corresponding data pad of the data pad part 13 and the data line 12.

The common voltage line part 15 includes a plurality of common voltage link lines that are formed inside the seal pattern 30 at certain intervals. One side end of each of the common voltage lines is electrically connected to the common voltage pad part 13c through one common voltage extension line 15a. Furthermore, a common voltage connection line (not shown) is electrically connected to a common electrode (not shown) which is formed in a corresponding pixel area.

The gate link part 16 includes a gate start signal line, a plurality of clock signal lines, a forward signal line, a backward signal line, a reset signal line, and a ground voltage line which are formed at certain intervals between the common voltage line part 15 and the built-in shift register 17. Each of the signal lines of the gate link part 16 is electrically connected to the gate pad part 13b of the pad part 13 through a gate link line 16a. Each signal line of the gate link part 16 is selectively connected to the built-in shift register 17 through a gate control signal connection line 16b.

The built-in shift register 17 is formed in the non-display area NDA of the first substrate 10 simultaneously with the above-described process of forming the thin film transistors T. The built-in shift register 17 generates the gate signal with a gate start signal, a plurality of clock signals, a forward signal, a backward signal, a reset signal, and a ground voltage which are supplied from the gate link part 16, and supplies the gate signal to the gate lines 11. To this end, the built-in shift register 17 includes a plurality of stages 17s respectively connected to the gate lines 11.

Each of the stages 17s supplies a clock signal, supplied through one of the clock signal lines, as the gate signal to a corresponding gate line 11 in response to the gate start signal which is supplied from the gate start signal line or a previous stage. The stages 17s sequentially operate according to the gate start signal which is supplied from the gate start signal line or a previous stage, and thus sequentially supply the gate signal from the first gate line to the last gate line or sequentially supply the gate signal from the last gate line to the first gate line.

The second substrate 20 includes a black matrix (not shown) that is defined in each pixel area of the first substrate 10, and a color filter layer (not shown) that is formed to overlap each pixel area of the first substrate 10. The second substrate 20 has a size corresponding to the size of the first substrate 10 except the size of the pad part 13 of the first substrate 10.

The seal pattern 30 is formed along the non-display area NDA of the first substrate 10 to overlap an edge portion of the second substrate 20, and facing-couples the first and second substrates 10 and 20 with the liquid crystal layer therebetween. In this case, the seal pattern 30 overlaps the edge portion of the second substrate 20, and is formed at an outer portion of the common voltage line part 15 left and right with respect to the LCD device and formed at an outer portion of the display area DA upward and downward with respect to the LCD device.

In the related art GIP type LCD device, since the seal pattern 30 and the non-display area of the first substrate 10 cannot display an image, the seal pattern 30 and the non-display area of the first substrate 10 are covered by a case (not shown). Here, a portion covered by the case is called a bezel.

For this reason, in the related art GIP type LCD device, a bezel width is increased by the built-in shift register 17 and the seal pattern 30 which are disposed in the non-display area of the first substrate 10. Also, in the related art GIP type LCD device, since a scribing line overlaps the seal pattern 30 in a scribing process of cutting the coupled first and second substrates 10 and 20, it is not easy to perform the scribing process, and, a crack occurs in the first and second substrates 10 and 20 due to the reduced width of the seal pattern 30 and a portion of the seal pattern 30 which is cut by the scribing process, causing the decrease in rigidity of the first and second substrates 10 and 20.

SUMMARY

Accordingly, the present invention is directed to a display device that substantially obviates one or more problems due to limitations and disadvantages of the related art.

An aspect of the present invention is directed to provide a display device for decreasing a bezel width.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a display device including: a first substrate including a display area, which includes a pixel formed in a pixel area defined by a gate line and a data line which intersect, and a non-display area that includes a built-in shift register connected to the gate line and a gate link part connected to the built-in shift register; a second substrate facing the first substrate; and a seal pattern formed in the non-display area of the first substrate in correspondence with an edge portion of the second substrate to facing-couple the first and second substrates, wherein the seal pattern includes: a first hardening area hardened by a first hardening process to overlap a portion of the built-in shift register; and a second hardening area hardened by a second hardening process different from the first hardening process to overlap a portion of the built-in shift register.

The built-in shift register may include a switching element formed in the first substrate to overlap the first hardening area, the switching element including a plurality of openings which overlap the seal pattern.

The switching element may include: a gate electrode including the openings; a semiconductor layer formed on the gate electrode; and a source electrode and a drain electrode formed on the semiconductor layer.

In another aspect of the present invention, there is provided a display device including: a first substrate including a display area, which includes a pixel formed in a pixel area defined by a gate line and a data line which intersect, and a non-display area that includes a built-in shift register connected to the gate line and a gate link part connected to the built-in shift register; a second substrate facing the first substrate; and a seal pattern formed on a portion of the built-in shift register and the gate link part to facing-couple the first and second substrates, wherein the built-in shift register includes a switching element that is formed in an area overlapping the seal pattern to have a plurality of openings.

The switching element may include: a gate electrode including a plurality of gate protrusion electrodes that protrude at certain intervals to prepare the openings; a semiconductor layer formed on the gate protrusion electrodes; and a source electrode and a drain electrode formed on the semiconductor layer.

The seal pattern may include: a first hardening area hardened by a first hardening process to overlap some of the openings; and a second hardening area hardened by a second hardening process different from the first hardening process to overlap the gate link part.

The first hardening area may be hardened by the first hardening process using light, and the second hardening area may be hardened by the second hardening process using heat.

The first substrate may further include: a common electrode formed in the pixel area; and a common voltage line part formed in a non-display area adjacent to an outer portion of one side of the first substrate to apply a common voltage to the common electrode, and the seal pattern may further include a third hardening area hardened by the first hardening process to overlap the common voltage line part.

The first substrate may further include: a common electrode formed in the pixel area; and a common voltage line part formed in a non-display area adjacent to an outer portion of one side of the first substrate to apply a common voltage to the common electrode, and the second hardening area may overlap the gate link part and the common voltage line part.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Hereinafter, embodiments of the present invention will be described in detail with reference to the accompanying drawings.

Figure 2:
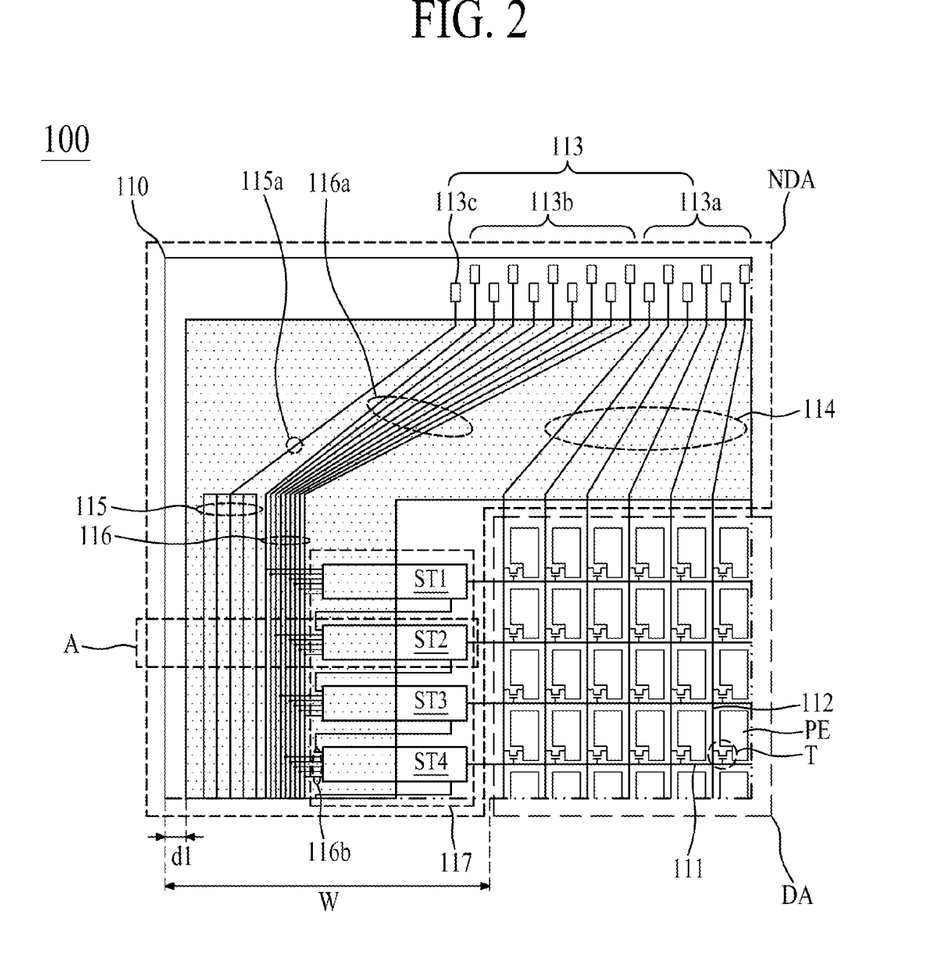
FIG. 2 is a plan view schematically illustrating a TFT array substrate according to an embodiment of the present invention.
Figure 3:
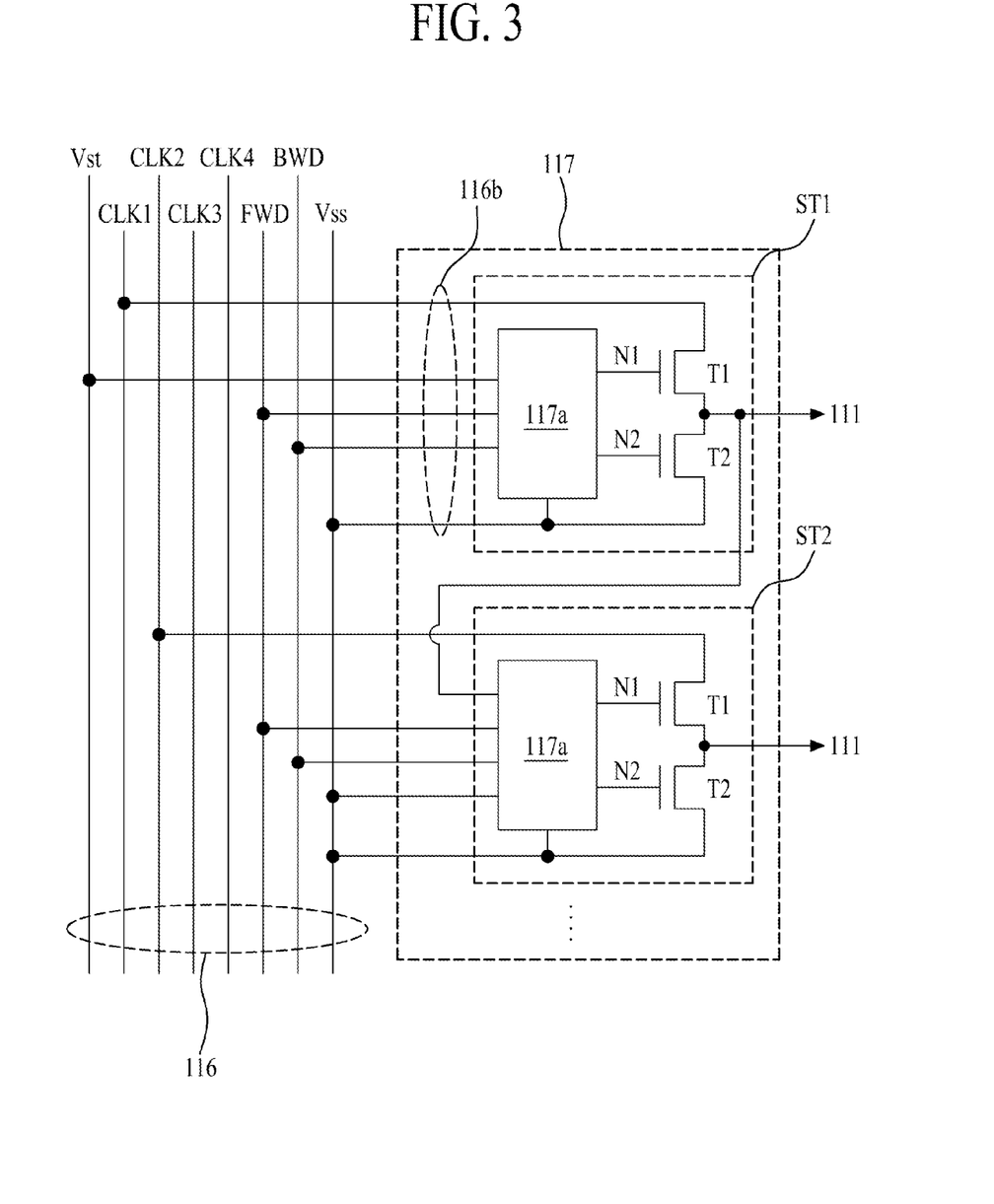
FIG. 3 is a circuit diagram schematically illustrating a portion of each of a built-in shift register and gate link part of FIG. 2.

FIG. 2 is a plan view schematically illustrating a TFT array substrate according to an embodiment of the present invention. FIG. 3 is a circuit diagram schematically illustrating a portion of each of a built-in shift register and gate link part of FIG. 2.

Referring to FIGS. 2 and 3, a TFT array substrate 100 according to an embodiment of the present invention includes: a substrate 110 that has a display area DA and a non-display area NDA; a plurality of gate lines 111 and a plurality of data lines 112 that are formed to intersect in the display area DA and define a plurality of pixel areas; a built-in shift register 117 that includes a plurality of switching elements having a plurality of openings, and is disposed in the non-display area NDA to be connected to the gate lines 111; and a gate link part 116 that is formed in the non-display area NDA, and connected to the built-in shift register 117.

The gate lines 111 and the data lines 112 are formed to intersect in the display area DA, and define the plurality of pixel areas. To this end, the gate lines 111 are formed at certain intervals along a width direction of the display area DA or a long side direction of the substrate 110, and the data lines 112 are formed at certain intervals along a length direction of the display area DA or a short side direction of the substrate 110.

A thin film transistor T and a pixel electrode PE are formed in each of the pixel areas.

The thin film transistor T is connected to an adjacent gate line 111 and an adjacent data line 112. The thin film transistor T includes a gate electrode protruding from the adjacent gate line 111, a semiconductor layer formed on the gate electrode, a source electrode that is formed on the semiconductor layer to protrude from the adjacent data line 112, and a drain electrode that is separated from the source electrode to surround the source electrode.

A pixel electrode PE is formed to be connected to the thin film transistor T, in each of the pixel areas. The pixel electrode PE is formed in plurality to have a certain interval, and connected to the drain electrode of the thin film transistor T. In this case, a plurality of common electrodes that are disposed in respective spaces between the pixel electrodes PE are formed in parallel with the respective pixel electrodes PE, in the respective pixel areas.

A pad part 113, a plurality of data link lines 114, a common voltage line part 115, a gate link part 116, and a built-in shift register 117 are disposed in the non-display area NDA of the substrate 110.

The pad part 113 includes a data pad part 113a, a gate pad part 113b, and a common voltage pad part 113c.

The data pad part 113a is disposed at an upper side of the non-display area NDA which is one side surface (upper side of a first gate line) of an upper side of the first substrate 110, and connected to an external driving circuit part (not shown). The gate pad part 113b is disposed at one side of the data pad part 113a, and connected to the external driving circuit part. The common voltage pad part 113c is disposed at one side of the gate pad part 113b, and connected to a common voltage generator (not shown) of the external driving circuit part.

The gate pad part 113b includes a plurality of gate pads that are disposed at certain intervals in one side of the data pad part 113a. The gate pad part 113b is connected to an external driving circuit part (not shown), and receives a gate control signal from the driving circuit part. Here, the gate control signal may include a gate start signal Vst, a plurality of clock signals CLK1 to CLK4, a forward signal FWD, a backward signal BWD, and a ground voltage Vss.

The common voltage pad part 113c includes at least one common voltage pad which is disposed at one side of the gate pad part 113b. The common voltage pad part 113c is connected to the external driving circuit part (not shown), and receives a common voltage from a common voltage generator of the driving circuit part.

Each of the data link lines 114 is extended from a corresponding data line 112, and connects a corresponding data pad of the data pad part 113a and the data line 112.

The common voltage line part 115 is disposed in a portion of the non-display area NDA which is separated by a first distance d1 from one side surface of the substrate 110. The common voltage line part 115 includes a plurality of common voltage link lines which are formed at certain intervals and connected to the common voltage pad part 113c in common. Here, the common voltage link lines are electrically connected to the common voltage pad part 113c through one common voltage link extension line 115a or a plurality of common voltage link extension lines 115a.

A line width of each of the common voltage link lines is formed broader than an interval between the common voltage link lines. Alternatively, an interval between the common voltage link lines is set to transmit light that hardens a seal pattern overlapping the common voltage line part 115.

The gate link part 116 includes a gate start signal line, a plurality of clock signal lines, a forward signal line, a backward signal line, a reset signal line, and a ground voltage line which are formed at certain intervals between the common voltage line part 115 and the built-in shift register 117. Each of the signal lines of the gate link part 116 is electrically connected to the gate pad part 113b of the pad part 113 through a gate link line 116a. Each signal line of the gate link part 116 is selectively connected to the built-in shift register 117 through a gate control signal connection line 116b.

The signal lines of the gate link part 116 are formed at intervals which are set to the minimum range unaffected by signal interference between adjacent signal lines. That is, since the seal pattern overlapping the gate link part 116 is hardened by heat, the signal lines of the gate link part 116 may be formed at intervals relatively narrower than an interval between the common voltage link lines. Therefore, in the present invention, the signal lines of the gate link part 116 are formed at narrowest intervals, thus increasing a space in which the built-in shift register 117 to be described below is disposed.

The built-in shift register 117 is disposed between the gate link part 116 and the display area DA, and connected to the gate link part 116 and the gate lines 111. The built-in shift register 117 includes a plurality of stages "ST1, ST2, . . . " respectively connected to the gate lines 111.

Each of the stages "ST1, ST2, . . . " includes a first switching element T1, a second switching element T2, and a node controller 117a.

The first and second switching elements T1 and T2 are connected to one gate line 111 in common.

The first switching element T1 is turned on according to a control by the node controller 117a, and supplies a clock signal CLK, which is supplied from one the clock signal lines (formed in the gate link part 116) through a gate control signal connection line 116b, as the gate signal to the gate line 111.

The second switching element T2 is turned on according to a control by the node controller 117a, and supplies a ground voltage Vss, which is supplied from the ground voltage line (formed in the gate link part 116) through the gate control signal connection line 116b, to the gate line 111.

The node controller 117a is connected to a first node N1 (which is connected to a gate electrode of the first switching element T1) and a second node N2 which is connected to a gate electrode of the second switching element T2, and moreover connected to a gate start signal line, forward signal line, backward signal line, and ground voltage line of the gate link part 116 through the gate control signal connection line 116b. The node controller 117a controls voltages of the first and second nodes N1 and N2 according to a gate start signal Vst supplied through the gate start signal line of the gate link part 116 or a gate signal, a forward signal FWD, and a backward signal BWD which are outputted from a previous stage. To this end, the node controller 117a includes a plurality of node control switching elements (not shown) that are organically turned on and switch the voltages of the first and second nodes N1 and N2 according to the gate start signal Vst or the gate signal, forward signal FWD, and backward signal BWD outputted from a previous stage, and at least one capacitor (not shown).

The first switching element T1 may have a relatively broad channel width (or area) for supplying a high-voltage gate signal to the gate line 111. Therefore, the first gate switching element T1 is disposed adjacently to the gate link part 116, and includes a space which is secured by an interval between the signal lines of the gate link part 116. Furthermore, a partial region of the first switching element T1 overlaps the seal pattern, and thus, the first switching element T1 includes a plurality of openings which enable the smooth transmission of light for hardening the overlapped seal pattern.

The below-described seal pattern is formed on the common voltage line part 115, the gate link part 116, and a portion of the built-in shift register 117. Therefore, in the TFT array substrate 100 according to an embodiment of the present invention, the seal pattern overlaps the common voltage line part 115, the gate link part 116, and the portion of the built-in shift register 117, thus decreasing a bezel width W formed by a case covering the non-display area NDA of the substrate 110.

Figure 4:
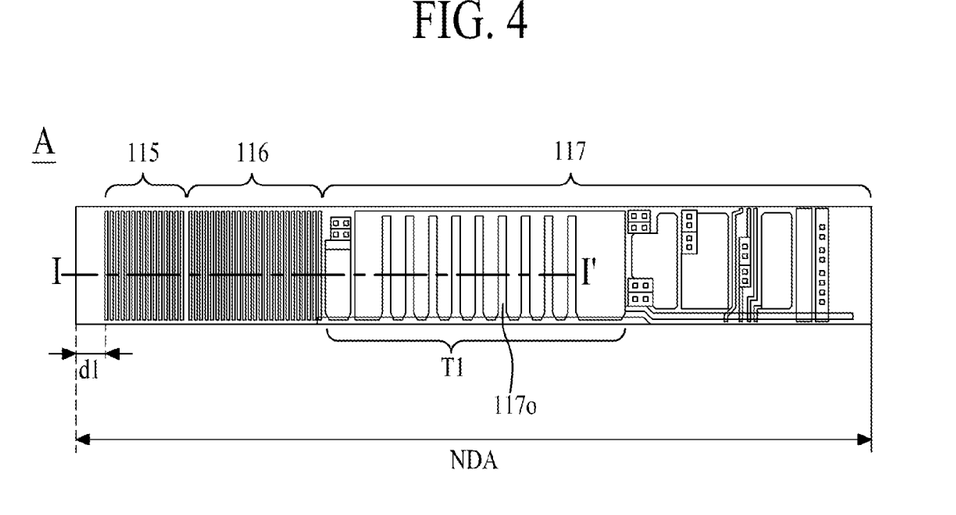
FIG. 4 is an enlarged view of a portion A of FIG. 2, and is a layout view illustrating a common voltage line part, gate link part, and built-in shift register of FIG. 2.
Figure 5:
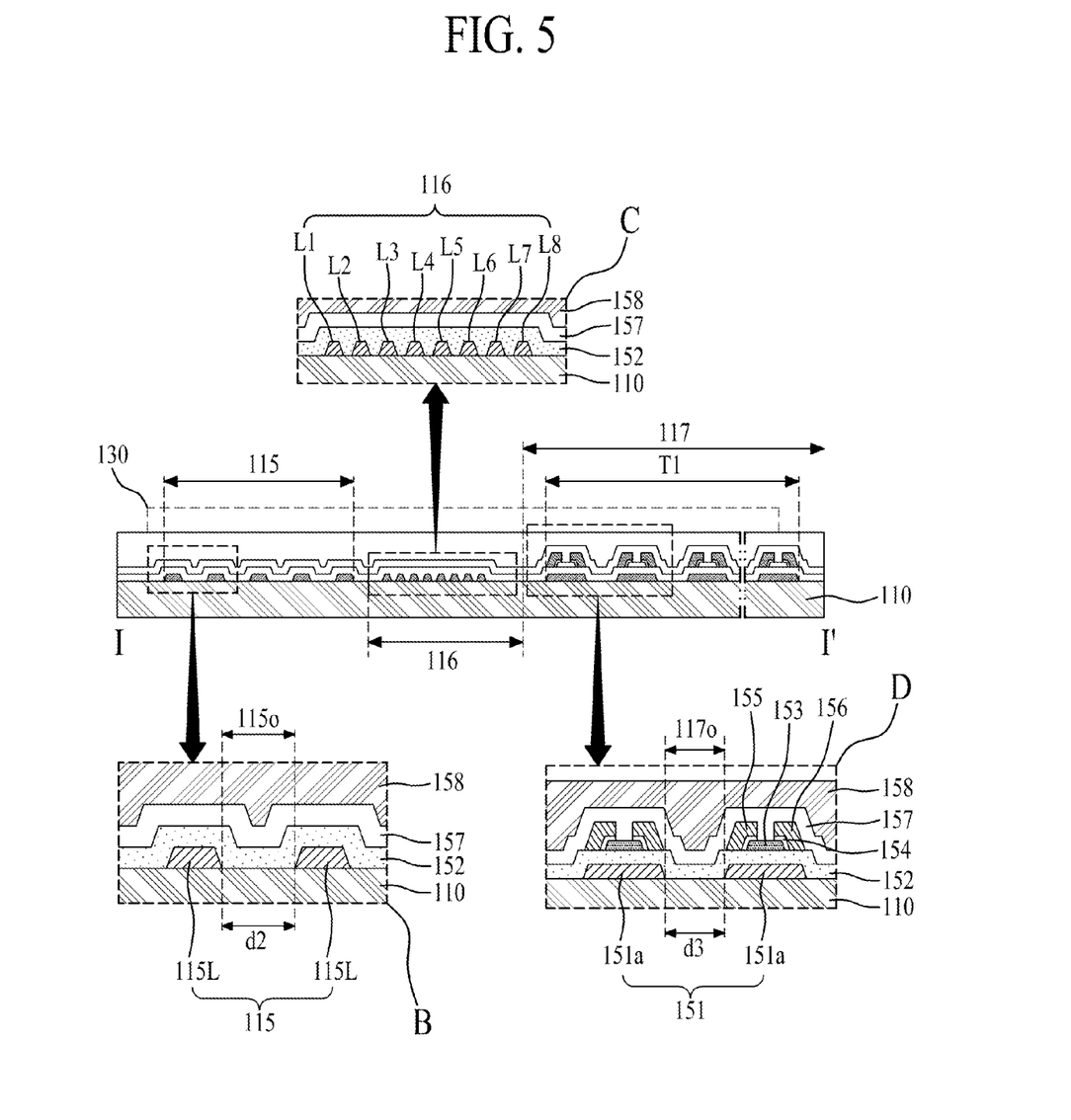
FIG. 5 is a sectional view schematically illustrating a cross-sectional surface taken along line I-I' of FIG. 4.

FIG. 4 is an enlarged view of a portion A of FIG. 2, and is a layout view illustrating a common voltage line part, gate link part, and built-in shift register of FIG. 2. FIG. 5 is a sectional view schematically illustrating a cross-sectional surface taken along line I-I' of FIG. 4.

The common voltage line part 115, the gate link part 116, and the built-in shift register 117 will be described below in detail with reference to FIGS. 4 and 5.

The common voltage line part 115 is disposed in an outer region of the non-display area NDA which is separated by the first distance d1 from one side end of the substrate 110. The first distance d1 becomes a scribing margin region for a panel scribing process which is performed after a process of coupling substrates.

The common voltage line part 115, as in an enlarged view of a portion B of FIG. 5, includes a plurality of common voltage link lines 115L which are formed of a gate material in the substrate 110 to have a second distance d2 therebetween. Therefore, in the common voltage line part 115, since the common voltage link lines 115L have the second distance d2 therebetween, an opening 115o is prepared between adjacent common voltage link lines. The opening 115o transmits light that hardens the seal pattern 130 formed on the common voltage line part 115, thus preventing the seal pattern 130 from being unhardened by the common voltage link lines.

The common voltage line part 115 may be covered by a gate insulation layer 152, an inter-layer dielectric 157, and a planarization layer 158. In this case, a portion of the inter-layer dielectric 157 and a portion of the planarization layer 158 which are disposed on the common voltage line part 115 may not be formed.

The gate link part 116 is disposed in a portion of the non-display are NDA adjacent to an inner side of the common voltage line part 115. The gate link part 116, as in an enlarged view of a portion C of FIG. 5, includes a gate start signal line L1, a plurality of clock signal lines L2 to L5, a forward signal line L6, a backward signal line L7, and a ground voltage line L8 which are formed of a gate material in the substrate 110 and disposed at certain intervals. The signal lines L1 to L8 of the gate link part 116 are disposed at minimum intervals, thus increasing a space in which the built-in shift register 117 to be described below is disposed.

The signal lines L1 to L8 of the gate link part 116 may be covered by the gate insulation layer 152, the inter-layer dielectric 157, and the planarization layer 158. In this case, a portion of the inter-layer dielectric 157 and a portion of the planarization layer 158 which are disposed on the gate link part 116 may not be formed.

In FIG. 5, each of the signal lines L1 to L8 of the gate link part 116 is not illustrated as one line, but is not limited thereto. As another example, each of the signal lines L1 to L8 of the gate link part 116 may be formed in plurality.

The built-in shift register 117 is disposed in the non-display area NDA between the gate link part 116 and the display area DA. As described above with reference to FIG. 5, the built-in shift register 117 includes the first switching element T1, the second switching element T2, and the node controller 117a that includes the plurality of node control switching elements and the at least one capacitor.

The first switching element T1 of the built-in shift register 117 is formed to have a relatively large size, in an area including an area secured by the gate link part 116. Specifically, as in an enlarged view of a portion D of FIG. 5, the first switching element T1 includes a gate electrode 151, a semiconductor layer 153, a source electrode 155, and a drain electrode 156. The first switching element T1 having the configuration is formed simultaneously with a process of forming the thin film transistors T which are formed in the respective pixel areas of the display area DA.

The gate electrode 151 includes a common gate electrode which is formed of a gate material in the substrate 110 to have a "-"-shape, and a plurality of gate protrusion electrodes 151a which protrude by a third distance d3 from the common gate electrode and respectively prepare the plurality of openings 117o. That is, the gate electrode 151 has an E-shape due to the common gate electrode and the gate protrusion electrodes 151a, and the openings 117o are prepared in respective gaps between the plurality of gate protrusion electrodes 151a.

The gate electrode 151 is covered by the gate insulation layer 152.

The semiconductor layer 153 is formed on the gate insulation layer 152 to overlap the gate electrode 151, namely, the gate protrusion electrodes 151a.

The source electrode 155 is formed in a first region of the semiconductor layer 153 to overlap the gate electrode 151. That is, the source electrode 155 may include a common source electrode overlapping the common gate electrode of the gate electrode 151, and a plurality of source protrusion electrodes respectively overlapping the gate protrusion electrodes 151a. The source electrode 155 is connected to one of the clock signal lines L2 to L5 through a gate control signal connection line.

The drain electrode 156 is formed in a second region of the semiconductor layer 153 to be separated from the source electrode 155, and surrounds the source electrode 155. That is, the drain electrode 156 may include a common drain electrode connected to respective distal ends of the gate protrusion electrodes 151a, and a plurality of drain protrusion electrodes respectively overlapping the gate protrusion electrodes 151a. The drain electrode 156 is connected to the gate line through an internal connection line of the built-in shift register 117.

Each of the source electrode 155 and drain electrode 156 may ohmic-contact the semiconductor layer 153 through the ohmic contact layer 154.

The source electrode 155 and the drain electrode 156 are covered by the inter-layer dielectric 157 and the planarization layer 158. In this case, the planarization layer 158 may not be formed.

The common voltage line part 115, the gate link part 116, and some openings 117o of the switching element T1 formed in the built-in shift register 117 overlap the seal pattern 130 formed in the non-display area NDA of the substrate 110. That is, the TFT array substrate 100 includes a seal pattern area defined in the non-display area NDA of the substrate 110, and the seal pattern area includes the common voltage line part 115, the gate link part 116, and some openings 117o of the switching element T1.

It has been described above that the built-in shift register 117 is formed in order for the first switching element T1 to have a relatively large size and has the plurality of openings 117o formed by the respective gaps between a plurality of the gate electrodes 151, but the built-in shift register 117 is not limited thereto. As another example, the built-in shift register 117 may be formed such that the second switching element T2 or one of the switching elements (included in the node controller 117a) instead of the first switching element T1 is disposed adjacently to the gate link part 116 and has the plurality of openings.

On the other hand, in the TFT array substrate 100, it has been described above that the common voltage line part 115, the gate link part 116, and the built-in shift register 117 are disposed at one side of the non-display area NDA, but the TFT array substrate 100 is not limited thereto. As another example, the common voltage line part 115, the gate link part 116, and the built-in shift register 117 may be disposed in the non-display area adjacent to both sides of the display area, and overlap the seal pattern 130. In this case, each built-in shift register formed in one side non-display area of the display area may contact an odd-numbered gate line, and each built-in shift register formed in the other side non-display area of the display area may contact an even-numbered gate line.

Figure 6:
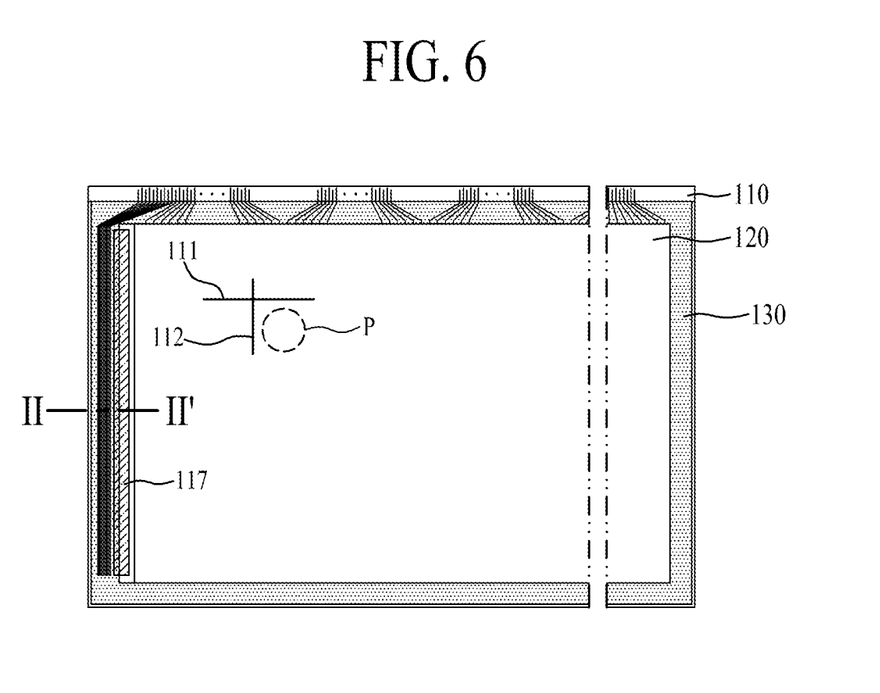
FIG. 6 is a plan view schematically illustrating a display device according to an embodiment of the present invention.
Figure 7:
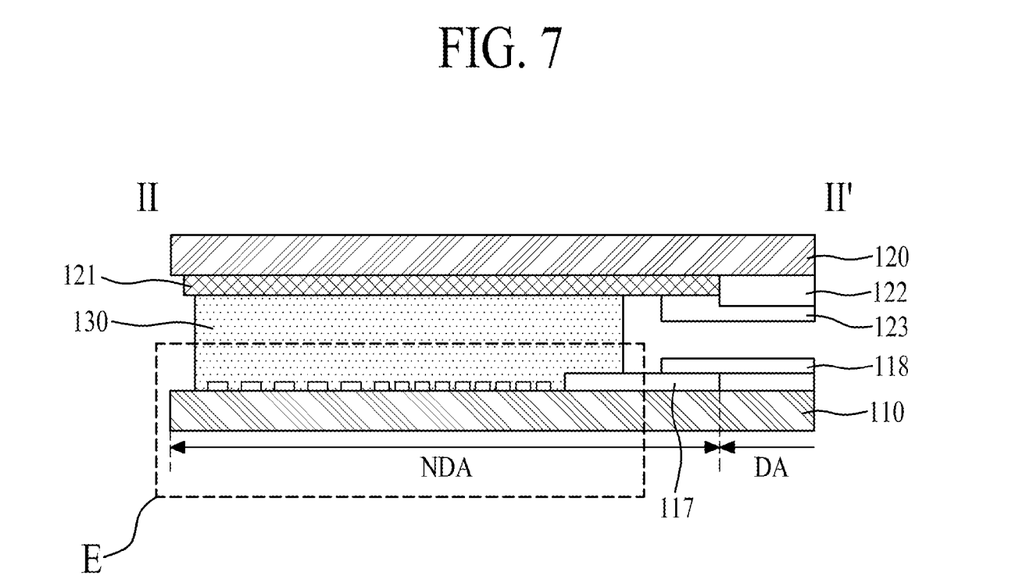
FIG. 7 is a sectional view schematically illustrating a cross-sectional surface taken along line II-II' of FIG. 6.
Figure 8:
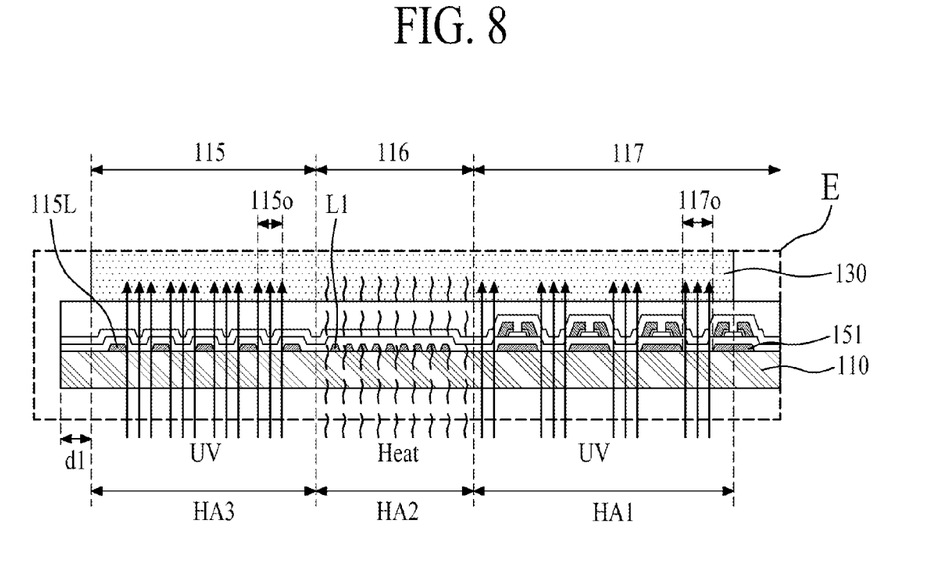
FIG. 8 is a sectional view schematically illustrating an enlarged portion E of FIG. 7.

FIG. 6 is a plan view schematically illustrating a display device according to an embodiment of the present invention. FIG. 7 is a sectional view schematically illustrating a cross-sectional surface taken along line II-II' of FIG. 6. FIG. 8 is a sectional view schematically illustrating an enlarged portion E of FIG. 7.

Referring to FIGS. 6 to 8, the display device according to an embodiment of the present invention has a display area DA and a non-display area NDA, and includes the first substrate 110 including the gate link part 116 and built-in shift register 117 disposed in the non-display area NDA, and a second substrate 120 which is facing-coupled to the first substrate 110 by the seal pattern 130. The seal pattern 130 has a first hardening area HA1 overlapping a portion of the built-in shift register 117 and a second hardening area HA2 overlapping the gate link part 116.

The first substrate 110 includes the display area DA including a pixel P formed in a pixel area that is defined by a gate line 111 and a data line 112 which intersect, and the non-display area NDA which includes the built-in shift register 117 connected to the gate line 111 and the gate link part 116 connected to the built-in shift register 117. The first substrate 110 is configured identically to the TFT array substrate 100 of FIGS. 2 to 5, and thus, its repetitive description is not provided. Like reference numerals refer to like elements throughout.

A first alignment layer 118 may be formed in the display area DA of the first substrate 110. The first alignment layer 118 aligns liquid crystal molecules of a liquid crystal layer (not shown), formed between the first and second substrates 110 and 120, in a certain direction.

The second substrate 120 is a color filter array substrate, and includes a light blocking pattern 121, a color filter pattern 122, and a second alignment layer 123.

The light blocking pattern 121 is formed in an area except a light transmitting area overlapping the pixel area of the first substrate 110, in the second substrate 120. The light blocking pattern 121 blocks light which travels to an area except the light transmitting area.

The color filter pattern 122 is formed in the light transmitting area prepared by the light blocking pattern 121, and overlaps the pixel area of the first substrate 110. In this case, the color filter pattern 122 includes red, green, and blue color filters so as to correspond to colors of respective pixels formed in the pixel area of the first substrate 110.

The second alignment layer 123 is formed to cover the light blocking pattern 121 and the color filter pattern 122, and both the second alignment layer 123 and the first alignment layer 118 align the liquid crystal molecules of the liquid crystal layer in a certain direction. The second alignment layer 123 may be formed on an overcoat layer (not shown) which is formed in the second substrate 120 to cover the light blocking pattern 121 and the color filter pattern 122.

The second substrate 120 is facing-coupled to the first substrate 110 by the seal pattern 130, and has a size overlapping a portion except a pad part prepared in an upper non-display area of the first substrate 110

The seal pattern 130 is formed along the non-display area NDA of the first substrate 110 in correspondence with an edge portion of the second substrate 120, and facing-coupled to the first and second substrates 110 and 120 with the liquid crystal layer therebetween.

An outer portion of the seal pattern 130 is separated by the first distance d1, namely, a scribing margin from an outer surface of the first substrate 110, and does not overlap a scribing line. Furthermore, the seal pattern 130 overlaps an edge portion of the second substrate 120, is formed at an outer portion of the common voltage line part 15 left and right with respect to the display device, and is formed at an outer portion of the display area DA upward and downward with respect to the display device.

The seal pattern 130 is formed to overlap the common voltage line part 115, the gate link part 116, and a portion of the built-in shift register 117 which are formed in the first substrate 110. The seal pattern 130 has a first hardening area HA1 which overlaps a portion of the built-in shift register 117 to be adjacent to the display area DA, a second hardening area HA2 which overlaps the gate link part 116 to be adjacent to the first hardening area HA1, and a third hardening area HA3 which overlaps the common voltage line part 115 to be adjacent to a distal end of a side surface of the first substrate 110.

The first hardening area HA1 is formed by a first hardening process using light such as ultraviolet (UV). Here, the first hardening process may use a backside irradiation process that irradiates UV from a lower portion of the first substrate 110. Therefore, UV passing through the first substrate 110 is irradiated onto the seal pattern 130 through the openings 117o prepared in the switching element T1 of the built-in shift register 117, and hardens an internal area of the seal pattern 130, thereby forming the first hardening area HA1.

The second hardening area HA2 is formed by a second hardening process using heat. Here, the second hardening process may apply heat from the lower or upper portion of the first substrate 110 to the second hardening area HA2 of the seal pattern 130.

When the second hardening area HA2 is hardened by a UV hardening process, it is required to separate the signal lines of the gate link part 116 such that the seal pattern overlapping the signal lines of the gate link part 116 is hardened with UV, and thus, an area in which the gate link part 116 is formed increases, causing the increase in a bezel width.

The third hardening area HA3 is formed by the first hardening process using light such as UV. Therefore, UV passing through the first substrate 110 is irradiated onto the seal pattern 130 through the openings 117o prepared between the common voltage link lines 115L of the common voltage line part 115, and hardens an outer area of the seal pattern 130, thereby forming the third hardening area HA3.

The third hardening area HA3 is disposed at an outer portion of the substrate 110, and thus may be formed by the second hardening process using heat instead of the first hardening process using light. When the third hardening area HA3 is formed by a heat hardening process, an interval between the common voltage link lines 115L of the common voltage line part 115 can become narrower, thus more decreasing a bezel width.

The display device according to an embodiment of the present invention may further include a guide frame (not shown) that supports a display panel including the first and second substrates 110 and 120 facing-coupled to the seal pattern 130, a backlight unit (not shown) that irradiates light on the display panel, a lower case (not shown) that receives the backlight unit and supports the guide frame, and an upper case that covers a non-display area of the display panel. Here, a front edge portion of the display panel covered by the upper case is called a bezel.

On the other hand, in the display device according to an embodiment of the present invention, it has been described above that the common voltage line part 115, the gate link part 116, and the built-in shift register 117 are disposed at one side of the non-display area NDA, but the TFT array substrate 100 is not limited thereto. As another example, the common voltage line part 115, the gate link part 116, and the built-in shift register 117 may be disposed in the non-display area adjacent to both sides of the display area, and overlap the seal pattern 130. In this case, each built-in shift register formed in one side non-display area of the display area may contact an odd-numbered gate line, and each built-in shift register formed in the other side non-display area of the display area may contact an even-numbered gate line.

In the display device according to an embodiment of the present invention, the built-in shift register 117 including the switching element having the plurality of openings is formed in the non-display area NDA of the first substrate 110, and the seal pattern 130 is formed to overlap the built-in shift register 117, thus decreasing the bezel width formed by the case covering the non-display area NDA. Also, since the seal pattern 130 does not overlap the scribing line, the existing limitations due to the overlap of the seal pattern 130 and the scribing line can be prevented.

In the TFT array substrate and the display device including the same according to the embodiments of the present invention, the above description has focused on the LCD device including the backlight unit, but the TFT array substrate and the display device including the same according to the embodiments of the present invention are not limited to the LCD device. As another example, the present invention may be applied to various flat panel display devices such as organic light emitting display devices (for example, organic light emitting diode display devices). For example, in the organic light emitting display devices, similarly to the present invention, the gate link part and the built-in shift register are built in the first substrate, namely, the non-display area of the TFT array substrate, and the seal pattern is formed to overlap the gate link part and the built-in shift register, in which case an internal area of the seal pattern adjacent to the display area may be hardened with light and the other area of the seal pattern may be hardened with heat.

The display device including the TFT array substrate according to the embodiments of the present invention may be applied to televisions and monitors, and moreover used as an image display means for notebook computers, tablet computers, and various portable information devices.

According to the embodiments of the present invention, the gate link part and the built-in shift register including a plurality of switching elements having a plurality of openings are disposed in the non-display area of the first substrate, and the seal pattern is formed to overlap the gate link part and the built-in shift register, thus decreasing the bezel width formed by the case covering the non-display area.

Moreover, since the seal pattern does not overlap the scribing line, it is easy to perform the scribing process, and the present invention can prevent a crack from occurring in each substrate due to the seal pattern and thus prevent the reduction in rigidity of the display panel.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A display device, comprising:
 a first substrate comprising a display area, which comprises a pixel formed in a pixel area defined by a gate line and a data line which intersect, and a non-display area that comprises a built-in shift register connected to the gate line and a gate link part connected to the built-in shift register;

a second substrate facing the first substrate; and a seal pattern formed in the non-display area of the first substrate in correspondence with an edge portion of the second substrate to facing-couple the first and second substrates, wherein the seal pattern comprises:

a first hardening area hardened by a first hardening process to overlap a portion of the built-in shift register; and a second hardening area hardened by a second hardening process different from the first hardening process to overlap a portion of the built-in shift register.

2. The display device of claim 1, wherein the built-in shift register comprises a switching element formed in the first substrate to overlap the first hardening area, the switching element comprising a plurality of openings which overlap the seal pattern.

3. The display device of claim 2, wherein the switching element comprises:

a gate electrode comprising the openings;

a semiconductor layer formed on the gate electrode; and a source electrode and a drain electrode formed on the semiconductor layer.

4. The display device of claim 2, wherein, the first hardening area is hardened by the first hardening process using light, and the second hardening area is hardened by the second hardening process using heat.

5. The display device of claim 4, wherein, the first substrate further comprises: a common electrode formed in the pixel area; and a common voltage line part formed in a non-display area adjacent to an outer portion of one side of the first substrate to apply a common voltage to the common electrode, and the seal pattern further comprises a third hardening area hardened by the first hardening process to overlap the common voltage line part.

6. The display device of claim 4, wherein, the first substrate further comprises: a common electrode formed in the pixel area; and a common voltage line part formed in a non-display area adjacent to an outer portion of one side of the first substrate to apply a common voltage to the common electrode, and the second hardening area overlaps the gate link part and the common voltage line part.

7. The display device of claim 4, wherein the second hardening area overlaps a portion of one side of the built-in shift register adjacent thereto.

8. The display device of claim 1, wherein an outer portion of the seal pattern is separated by a certain distance from a side surface of the first substrate.

9. A display device, comprising:

a first substrate comprising a display area, which comprises a pixel formed in a pixel area defined by a gate line and a data line which intersect, and a non-display area that comprises a built-in shift register connected to the gate line and a gate link part connected to the built-in shift register;

a second substrate facing the first substrate; and a seal pattern formed on a portion of the built-in shift register and the gate link part to facing-couple the first and second substrates, wherein the built-in shift register comprises a switching element that is formed in an area overlapping the seal pattern to have a plurality of openings.

10. The display device of claim 9, wherein the switching element comprises:

a gate electrode comprising a plurality of gate protrusion electrodes that protrude at certain intervals to prepare the openings;

a semiconductor layer formed on the gate protrusion electrodes; and a source electrode and a drain electrode formed on the semiconductor layer.

11. The display device of claim 9, wherein the seal pattern comprises:

a first hardening area hardened by a first hardening process to overlap some of the openings; and a second hardening area hardened by a second hardening process different from the first hardening process to overlap the gate link part.

12. The display device of one of claim 11, wherein, the first hardening area is hardened by the first hardening process using light, and the second hardening area is hardened by the second hardening process using heat.

13. The display device of claim 12, wherein, the first substrate further comprises: a common electrode formed in the pixel area; and a common voltage line part formed in a non-display area adjacent to an outer portion of one side of the first substrate to apply a common voltage to the common electrode, and the seal pattern further comprises a third hardening area hardened by the first hardening process to overlap the common voltage line part.

14. The display device of claim 12, wherein, the first substrate further comprises: a common electrode formed in the pixel area; and a common voltage line part formed in a non-display area adjacent to an outer portion of one side of the first substrate to apply a common voltage to the common electrode, and the second hardening area overlaps the gate link part and the common voltage line part.

15. The display device of claim 12, wherein the second hardening area overlaps a portion of one side of the built-in shift register adjacent thereto.

16. The display device of claim 9, wherein an outer portion of the seal pattern is separated by a certain distance from a side surface of the first substrate.

* * * * *